United States Patent [19]

Horne, Jr. et al.

[11] 4,284,612

[45] Aug. 18, 1981

[54] PREPARATION OF SIC WHISKERS

[75] Inventors: Ottis J. Horne, Jr., Johnson City; Lloyd I. Grindstaff, Elizabethton, both of Tenn.

[73] Assignee: Great Lakes Carbon Corporation, New York, N.Y.

[21] Appl. No.: 115,683

[22] Filed: Jan. 28, 1980

[51] Int. Cl.³ ............................................. C01B 31/36
[52] U.S. Cl. ....................................... 423/345; 106/44
[58] Field of Search ........................... 423/345; 106/44

[56] References Cited

U.S. PATENT DOCUMENTS

| | | |
|---|---|---|
| 3,285,696 | 11/1966 | Tsunoda . |
| 3,412,062 | 11/1968 | Johnson et al. . |
| 3,503,708 | 3/1970 | Spry . |
| 4,014,725 | 3/1977 | Schulz . |

FOREIGN PATENT DOCUMENTS

| | | | |
|---|---|---|---|
| 48-22920 | 7/1973 | Japan | ....................................... 423/345 |
| 998089 | 7/1965 | United Kingdom . | |

OTHER PUBLICATIONS

Lee et al., "Am. Ceram. Soc. Bull.", vol. 54, No. 2, 1975, pp. 195-198.

*Primary Examiner*—Jack Cooper
*Attorney, Agent, or Firm*—Adrian J. Good

[57] ABSTRACT

Organic fibers are oxidized, ground and blended with a source of silica. Heat treatment of the blend in the range of 1400° to 1700° C. results in the formation of SiC whiskers. Various fibers including PAN, pitch and rayon which can be processed to form carbon and/or graphite fibers can be used as the carbon source. Ashed rice hulls as the source of silica are blended with the chopped fiber to form the SiC whiskers.

16 Claims, No Drawings

PREPARATION OF SIC WHISKERS

BACKGROUND OF THE INVENTION

Silicon carbide in the form of whiskers with a high aspect ratio of length to diameter has been proposed for use as a reinforcement in aluminum metal to increase its modulus of elasticity and greatly enhance its utility for the most critical aerospace applications. It has been reported that an addition of 25 volume % of SiC powder, of which about 20% was in the form of whiskers, increased the Young's modulus of the standard aircraft alloy 2024-T4 by approximately 100%, and the ultimate tensile strength by approximately 50%.

Silicon carbide occurs in two crystal forms, a $\beta$ form which is cubic and an $\alpha$ form which crystalizes in both hexagonal and rhombohedral classes in a number of polytypes. Although there are broad temperature ranges in which either may form, in general, temperatures higher than 1900° C. favor the formation of the $\alpha$ form and temperatures between 1200° to 1900° C. favor the formation of the $\beta$ form. The $\alpha$ type is preferred as an abrasive due to its hardness, while the $\beta$ form has been of little commercial importance.

SiC whiskers have been made by the methods disclosed by Cutler in U.S. Pat. No. 3,754,076, (1973); by Adamsky and Merz, Z. Krist 111, 350-361 (1959); and by Hamilton, J. Appl. Phys 31, 112-116 (1960); see Kirk-Othmer Enc. Chem. Tech. Vol. 4, 2nd Ed. Wiley & Sons, N.Y., 1964, (117-118). U.S. Pat. No. 3,269,802 by Wainer et al., Aug. 30, 1966, Class 23-349 discloses the preparation of carbide products by carbonizing filaments or felts then converting the carbonized product in an atmosphere of a halide or carbonyl of the carbide forming element. U.S. Pat. No. 3,403,008 by Hamling, class 23-344, Sept. 24, 1968, discloses the production of metal carbide fibers, textiles, and shaped articles by impregnating a pre-formed organic polymeric material with a solution of a metal compound, heating the impregnated material to leave a carbonaceous relic containing the metal in a finely dispersed form and further heating the relic to 1000° to 2000° C. in a non-oxidizing atmosphere to form the metal carbide. U.S. Pat. No. 3,640,693 by Galasso, class 55/2, Feb. 8, 1972, discloses a process for producing high modulus fibers by forming a silicon metal fiber in a glass tube to form a composite, removing the glass sheath and contacting the exposed silicon core with a suitable reactant such as methane to form the SiC fiber. U.S. Pat. No. 4,127,659 by DeBolt et al., Class 427/249, Nov. 28, 1978, discloses a refractory substrate of graphite or carbon overcoated with SiC by deposition from gaseous sources of silicon in combination with hydrogen. British Pat. No. 998,089 by Evans et al., Int. Cl:-C01b, July 14, 1965, discloses the production of refractory carbide fiber by heating a cloth woven from cellulosic or other organic material such as viscose rayon in an inert atmosphere. The carbon cloth is then completely imbedded in fine powdered silicon and heated in an inert atmosphere or argon to 1410° C. for between 4 and 24 hours, forming a SiC cloth in the original shape. Japanese Pat. No. 52/113,300 by Tokai Carbon K.K., Cl. C01b-31/36, Oct. 3, 1978, discloses heating rice chaff in a vessel by high-frequency radiation in a tube-type furnace under CO atmosphere at 1700°-2000° C. to form $\alpha$-SiC whiskers.

U.S. Pat. No. 3,412,062, Johnson, Nov. 19, 1968, discloses carbon fibers from PAN polymers. U.S. Pat. No. 3,503,708, Spry, Mar. 31, 1970, discloses carbon fibers produced from rayon. U.S. Pat. No. 4,014,725, Schulz, Mar. 29, 1977, discloses mesophase pitch based carbon fibers. U.S. Pat. No. 3,285,696, Tsunoda, Nov. 16, 1966, discloses PAN copolymer based carbon fibers.

Considerable scientific study of whiskers has been done, and their properties have been found to be of great utility in reinforcing lower modulus solids, but commercial development has been limited due to the extremely high cost of production. Typically they are produced in gas-phase reactions with low yields in expensive processes, which has limited availability to that of laboratory samples.

One of the problems unsolved until the present invention was that of obtaining a reasonable yield of whiskers. When attempting to manufacture whiskers, about 20-25% of the SiC obtained is the maximum obtained in the whisker form, the rest being irregularly shaped particles of little or no value as reinforcement.

It is difficult to separate the whiskers from the powder due to their small size. Mechanical screening is slow and imperfect, while air classification has so far been unsuccessful. Consequently, it is imperative to have the whiskers in high yield if the material is ever to become a large scale commercial product.

SUMMARY OF THE INVENTION

SiC whiskers in high yield are produced from ground oxidized or carbonized organic fibers, preferably those made from the polymers and copolymers of polyacrylonitrile known in industry as PAN fibers. Other fibers may be used, however they have not been as productive of high quality whiskers as PAN based fibers.

During the production of carbon and graphite fibers, which are not part of this invention, the PAN precursor is stretched in an atmosphere of steam, oxidized at approximately 200° to 400° C., then carbonized at temperatures of 800° to 1000° C. and graphitized at temperatures of 1200° to 2200° C. Whereas previous workers have produced SiC fibers from the fully carbonized fibers, we have found that we obtain superior results by the use of the oxidized PAN fibers. The best SiC whisker content has been obtained by placing a blend of ground oxidized PAN tow (45 wt.%) and ashed ground rice hulls (55 wt.%) in a furnace preheated to 1500° C., taking approximately 15 minutes to reach that temperature. Argon was used to purge the furnace during heating. The sample was heated for 2 hours at 1500° C. The resulting material had a high quantity of SiC whiskers of good aspect ratios suitable for reinforcement applications from 30 to 60% $SiO_2$ and from 70 to 40% oxidized organic fiber by wt. appear to be the range of optimum proportions.

Any source of $SiO_2$ may be used. However, amorphous $SiO_2$ is preferred because of its greater reactivity and the silica obtained from rice hulls ashed at 400°-700° C. has been found to be preferable because of its amorphous form, high surface area, and high reactivity. If the rice hulls are ashed at over 700° C., the less reactive crystalline form predominates.

The overall reaction is represented as

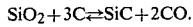

The initial reaction is the reduction of silica to silicon by the reaction starting at approximately 1000° C.:

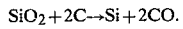

As the temperature increases to 1400°–1500° C., this reaction becomes very rapid. With excess fiber present the reaction proceeds another step to form the carbide:

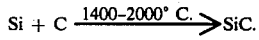

The reactions of reduction and carbide formation above must be carried out in an inert atmosphere. If oxygen is present the carbon will merely oxidize to CO or $CO_2$ and, if nitrogen is present, silicon nitride will form preferentially over SiC by the reaction:

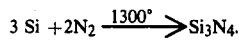

We have found that argon is preferable, although other inert gases may be used.

It was found that whisker formation occurred in much greater yield when the reaction was carried out rapidly and, to that end, one preferred method is mixing the silica and fibers, then loading the mixture into a preheated furnace with an argon atmosphere at 1500° C., for a rate of temperature increase of 100° to 200° C. per minute.

The addition of $Fe_2O_3$ also increases the speed of reaction, with quantities up to 14% to 28% of the $SiO_2$ found useful, and promotes the formation of longer and greater diameter whiskers.

A variation of the process which has also increased the whisker yield is the use of a CO atmosphere during the upheat stage. This shifts the equilibrium in the reaction:

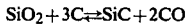

to the left as shown, suppressing the formation of silicon carbide in that stage. When the desired reaction temperature in the range of 1200°–1800° C. is reached, preferably 1500° C., the CO atmosphere is flushed with argon and the reaction proceeds rapidly with the formation of SiC whiskers of high aspect ratio (length to diameter typically 50 to 1) in high yield.

The overall reaction is postulated to proceed in the following manner, starting with a PAN homopolymer in this illustration for simplicity, although a copolymer or terpolymer based fiber is more commonly used. A number of reactions occur, including the formation of hydroxy, carbonyl, heterocyclic, and carboxyl groups, and rearrangement reactions. At this stage the fiber has an oxygen content of about 10% by wt. and is highly reactive with Si.

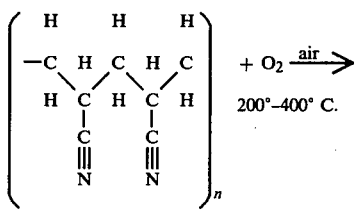

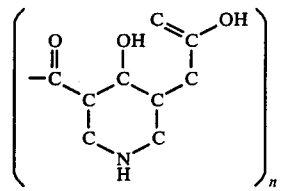

The partially oxidized tow is then carbonized in a nonoxidizing atmosphere at 800°–1000° C. to form the carbon fibers of commerce, which on further heating at 1200°–2200° C. form the well-known graphite fibers.

Fibers at any of the above stages of reaction may be used to form SiC whiskers, however we have found that we obtain best results with the oxidized stage of PAN fibers.

Other fibers are useful as raw materials for the SiC whiskers, including cotton, wool, nylon, carbonized rayon, carbonized alphacellulose and mesophase petroleum or coal tar pitch-based carbon fibers. However, oxidized PAN has proved superior to these other fibers in the quantity and quality of whiskers formed.

After the carbide forming step, the material may be ashed in air at 500° to 700° C. to remove excess unreacted carbon, treated with HF if excess $SiO_2$ remains, or treated with HCl to remove any remaining $Fe_2O_3$.

DESCRIPTION OF THE INVENTION

Results obtained are listed in Tables I, II, and III, and in the examples that follow.

EXAMPLE 1

11 g. of ash from rice hulls ashed one hour at 620° C. was mixed with 9 g. of ground oxidized (air at 300° C.) PAN (Orlon 43S by Du Pont) tow fibers of about 20μ mean length (range of about 10 to 100μ). The mixture was placed in a 3 inch diameter tube furnace under a CO atmosphere at 2 SCFH and the temperature raised to 1500° C. When the temperature reached 1500° C. in about 10 minutes, for a 150° per minute increase, the CO atmosphere was flushed with argon and the material held at that temperature for 2 hours under argon at 2 to 4 SCFH flow rate. The product obtained appeared to be essentially all whiskers. Product yield was 24% before ashing and a 23.0% overall batch yield after ashing. The batch was then leached with HF and a 2.9% weight loss on the ashed sample was obtained.

EXAMPLE 2

A charge of rice hulls was treated to extract furfural and the residue used as fuel in a boiler, in a well-known commercial process. 9 g. of oxidized PAN tow was ground to 20μ length and mixed with 11 g. of the rice hull ash so obtained, placed in a 3 inch diameter tube furnace preheated at 1800° C. under a flow of 4 SCFH of argon, and held for 1 hour, taking about 10 minutes to reach temperature. The product in 29.1% overall yield, based on $SiO_2$ content, had very good whiskers.

EXAMPLE 3

250 g. of oxidized PAN tow was ground and mixed with 250 g. of ashed ground rice hulls and placed in a boat in a 6″ tube furnace with an argon atmosphere flowing at 20 SCFH. The temperature was raised at a rate of 100° per minute to 1500° C. and held for 2 hours. The product yield before ashing was 173.4 g., after ashing 160.4 g., with qualitatively good whiskers present.

113 g. of the material was screened into +65 mesh, −65/+100 mesh, and −100 mesh fractions of 5.0 g., 27.2 g., and 80.5 g. The −65/+100 mesh fraction contained good whiskers and the −100 mesh fraction contained mostly clear fibers.

In most of the examples the −65/+100 mesh fraction contained an excellent quantity of whiskers and had reasonably low weight losses upon ashing. In contrast, the −100 mesh fraction contained mostly clear fibrous material with few or no whiskers apparent. In addition, higher weight losses were observed for the −100 than for the −65/+100 mesh fractions on ashing. The clear fibers in the −100 mesh fraction were essentially the same size as the ground fiber starting material. From this data, the fraction of product that is −65/+100 mesh can be used to determine the overall efficiency of the reaction.

EXAMPLE 4

124 g. of rice hull ash and 320 g. of ground oxidized PAN tow fibers (41.0% carbon yield after 1500° C.) were mixed and placed in a 6 inch diameter preheated tube furnace in an argon atmosphere with a flow rate of 20 SCFH and held at 1500° C. for 2 hours. The product (high in whisker content) had a 41.5% batch yield before ashing, a 32.4% yield after ashing, and after HF leaching showed a 2.1% weight loss on the ashed sample.

EXAMPLE 5

Several runs using a 6-inch-diameter tube furnace were made. Effects examined were maximum temperature, flow rate and ratio of oxidized tow to SiO$_2$ content. From the data in Table III, the following trends were observed:

(1) Overall yields, in general, increased as the oxidized fiber/SiO$_2$ ratio increased.

(2) For a particular composition and flow rate, the overall yield at 1625° C. was lower than the yield at 1500° C. The −65/+100 fraction of the 1625° C. product was less than the −65/+100 fraction of the 1500° C. product.

(3) At a particular composition and heat-treatment temperature, as the flow rate of argon increased, the overall yield and the percentage of −65/+100 fraction in the product increased.

The best conditions for SiC whisker preparation in a 6″ tube furnace appear to be the use of a stoichiometric ratio of carbon to SiO$_2$ heated rapidly to 1500° C. under a flow rate of 20 SCFH argon, at a rate of temperature increase which raises the temperature to 1500° C. in about 15 minutes for a 100°/minute rise. If the raw materials are placed in the furnace at ambient temperature, it normally takes about two hours to reach 1500° C., with an approximate 700° C./hour rate of increase.

EXAMPLE 6

The −100 mesh fraction from Example 4 above (13.2 g.) was mixed with a near stoichiometric quantity of rice hull ash (22 g.) and heated rapidly to 1500° C. in 4 SCFH argon and held under those conditions for 1 hour. A good quantity of SiC whiskers (15.1 g.) was obtained.

EXAMPLE 7

22.1 g. of chopped carbonized PAN tow (50% carbon yield after 1500° C.) was mixed with 11 g. diatomaceous earth (Dicalite 4500), placed in a boat in a 3″ tube furnace at 1500° C. in an argon atmosphere flowing at 2.0 CFH, and held for 1 hour. Almost all of the whiskers produced were in the −65/+100 mesh fraction, while clear fibers in the same shape as the original PAN tow were observed in the −100 mesh product. Yield of product at 14.8% was lower than with other SiO$_2$ sources.

EXAMPLE 8

SiC in the form of a clear fibrous product was obtained when blends of diatomaceous earth (Dicalite 4500) and chopped graphite fibers were heated to 1500° C. under argon as in the above examples.

EXAMPLE 9

A mixture of 12 g. ground mesophase pitch based carbon fiber and 20 g. of rice hull ash was heated under 4 SCFH argon at 1500° C. for 1 hour after being placed in a preheated 3 inch diameter tube furnace. The resulting product after ashing had 9.8 g. impure SiC whiskers of good quality.

EXAMPLE 10

A blend of chopped viscose rayon and rice hull ash fused when treated as in the above examples. No whiskers were found in the product.

EXAMPLE 11

Commercially available rayon based graphite fibers (Thornel 50 from Union Carbide Corporation) were ground to −100 mesh and 14 g. mixed with 20 g. of rice hull ash. The mixture was placed in a preheated tube furnace at 1500° C. and heated rapidly as in Example 3 above under an argon atmosphere, to yield 14.1 g. of product, which was screened and ashed with the following results:

−65/+100 mesh product yield—4.2 g.; yield after ashing—3.6 g.; fair whiskers;

−100 mesh product yield—9.8 g.; yield after ashing—7.9 g.; mostly clear fibers.

EXAMPLE 12

Several attempts were made to prepare SiC whiskers using raw alpha-cellulose filter aid and rice hull ash. In each case the product was a fused solid with no evidence of SiC formation.

EXAMPLE 13

Alpha-cellulose filter aid (Solka-Floc) was carbonized for one hr. in N$_2$ at 600° C. Then a mixture of 13.2 g. of the carbonized material and 11.0 g. rice hull ash was placed in the preheated tube furnace at 1500° C. in an argon atmosphere and held for one hour at that temperature with 12.2 g. of product obtained. Screening and ashing gave these results:

−65/+100 mesh product yield—3 g.; yield afer ashing—2.1 g.; good whiskers;

+100 mesh product yield—8.8 g.; yield after ashing—4.1 g.; few whiskers; mostly clear fibers.

TABLE I

EVALUATION OF RAW MATERIALS FOR SiC WHISKER PREPARATION

| Reactants* | Wt. g. | Argon Flow Rate SCFH | Temp. °C. | Whisker Quality | −65/+100 Mesh Content** g. |
|---|---|---|---|---|---|
| Oxidized PAN Tow-Rice Hull Ash 2113-7 | 9/11 | 4.0 | 1500 | Good | N.A. |
| Carbonized PAN Tow-Diatomaceous SiO$_2$ 2113-19 | 11.1/11 | 2.0 | 1500 | Clear Fibers, Few Whiskers | 1.6 |
| Carbonized PAN Tow-Rice Hull Ash 2113-23 | 16.5/11 | 2.0 | 1500 | Good | 2.7 |
| Oxidized PAN Tow-Amorphous SiO$_2$*** 2113-25 | 20.3/11 | 2.0 | 1500 | Fair, Mostly Clear Fibers | N.A. |
| Graphitized PAN Tow-Diatomceous SiO$_2$ 2113-20 | 11.1/11 | 2.0 | 1500 | Clear Fibers | 1.0 |
| Oxidized PAN Tow-Rice Hull Ash | 320/124 | 5.0 | 1625 | Good | 33.4 |

*Carbon Yields (After 1500° C.) of:
  Oxidized PAN = 40.6%;
  Carbonized PAN = 50%;
  Graphitized PAN = 95.0%.
**After ashing
***Laboratory reagent grade amorphous SiO$_2$, precipitated.

TABLE II

SCREEN ANALYSIS OF PRODUCT FROM HEAT TREATMENT OF OXIDIZED PAN TOW-RICE HULL ASH

| | |
|---|---|
| Wt. | 376/124 g. |
| Furnace | 6″ diam. |
| At'm | Ar |
| Flow Rate | 20.0 SCFH |
| Temp. | 1500° C. |
| Time | 2 hours |
| Yield - Before Ashing | 193.0 g. |
| Yield - After Ashing | 158.8 g. |
| Yield - +65 Mesh | 12.0 g. |
| Yield - −65/+100 Mesh | 48.2 g. |
| Ashed - −65/+100 Mesh | 43.7 g. - Good Whiskers |
| Yield - −100 Mesh | 125.8 g. |
| Ashed - −100 Mesh | 80.2 g. - Clear Fibers |

TABLE III

LARGE SCALE RUNS FROM OXIDIZED PAN TOW - RICE HULL ASH

| Wt. Ratio Tow/SiO$_2$ (g) | Argon Flow Rate SCFH | Temp. (°C.) | −65/+100 Mesh Content* (g) | Whisker Quality |
|---|---|---|---|---|
| 250/250 | 20 | 1500 | 27.8 | Good |
| 376/124 | 20 | 1500 | 43.7 | Good |
| 188/62 | 5 | 1500 | 24.1 | Good |
| 320/124 | 5 | 1500 | 32.0 | Good |
| 320/124 | 5 | 1625 | 33.4 | Good |
| 320/124 | 20 | 1500 | 47.7 | Good |

Hold Time: 2 hours
*After Ashing

We claim:

1. A process for the manufacture of SiC whiskers comprising the steps of:
   (1) Selecting an organic fiber from the group consisting of polymers, copolymers, and terpolymers of acrylonitrile oxidized in air at a temperature from 200° to 400° C.;
   (2) Grinding or chopping the fiber obtained in step 1 to form a short fiber of approximately 10 to 100$\mu$ length;
   (3) Mixing the ground fiber obtained above with amorphous SiO$_2$;
   (4) Placing the mixture obtained above in a furnace and increasing the temperature to a carbide-forming temperature within the range of of 1400° to 1800° C. in a non-oxidizing atmosphere;
   (5) When the temperature reaches said carbide-forming temperature, maintaining the mixture at that temperature in an atmosphere of inert gas for a period of 1 to 4 hours; and
   (6) Removing the product from the furnace.

2. The process of claim 1 wherein the non-oxidizing atmosphere in step 4 is CO.

3. The process of claim 1 wherein the inert gas and the non-oxidizing atmosphere is argon.

4. The process of claim 1 in which the SiO$_2$ is formed by ashing rice hulls at a temperature of 400° to 700° C. to obtain SiO$_2$.

5. The process of claim 1 wherein from 30 to 60% SiO$_2$ and from 70 to 40% oxidized organic fiber by weight are used as the ingredients of the carbide-forming mixture.

6. The process of claim 1 wherein the mixture is held at the carbide-forming temperature for approximately 1 hour.

7. The process of claim 1 wherein the mixture is held at a carbide-forming temperature of 1500° C.

8. The process of claim 1 wherein the organic fiber after oxidation at 200° to 400° C. in Step 1 is further carbonized at 800° to 1000° C. in nitrogen.

9. The process of claim 8 wherein the amorphous SiO$_2$ is diatomaceous earth.

10. The process of claim 1 in which the oxidized fiber is carbonized at 800° to 1000° C. then is further treated at a temperature of 1200° to 2200° C. in nitrogen to form a graphitized fiber.

11. A process for the manufacture of SiC whiskers comprising the steps of:
   (1) Carbonizing alpha-cellulose in nitrogen, for about one hour at 400° to 700° C.;
   (2) Mixing about 55 parts by wt. carbonized alphacellulose with about 45 parts by wt. amorphous SiO$_2$ obtained by ashing rice hulls at a temperature from 400° to 700° C.;
   (3) Placing the mixture in an inert atmosphere of argon; and (4) Rapidly heating the mixture at about 100° C. rise per minute to a carbide-forming temperature within the range of 1400° to 1800° C., and maintaining the mixture at that temperature under said inert atmosphere of argon for approximately one hour.

12. A process for the manufacture of SiC whiskers comprised of:
(1) Ashing rice hulls at a temperature from about 400° to 700° C. to form amorphous $SiO_2$;
(2) Mixing the ash with ground fibers from 10 to 100μ in length selected from the group consisting of polyacrylonitrile fibers oxidized in air at 200° to 400° C., carbonized polyacrylonitrile fibers, graphitized polyacrylonitrile fibers, graphitized viscose rayon, carbonized mesophase petroleum pitch fibers, and fibrous alpha-cellulose carbonized in a nonoxidizing atmosphere;
(3) Placing the mixture obtained in an inert atmosphere of argon;
(4) Increasing the temperature at a rate of from 100° C. to 200° C. per minute from ambient to a carbide-forming temperature between 1400° C. and 1800° C., holding the mixture at that temperature in argon for a period of approximately one hour to form SiC whiskers; and
(5) Removing the product from the heating chamber.

13. The process of claim 1 wherein the temperature of the mixture is raised to the carbide-forming temperature at a rate of approximately 100° C. to 200° C. per minute.

14. The process of claims 1, 11, or 12 wherein the product obtained is ashed in air at 500° to 700° C.

15. The process of claims 1, 11, or 12 wherein the product is screened into a fraction retained on a 65 mesh per inch screen, a fraction passing a 65 mesh per inch screen and retained on a 100 mesh per inch screen containing the SiC whiskers, and a fraction passing a 100 mesh per inch screen.

16. The process of claim 13 wherein the fraction passing a 100 mesh per inch screen is further reacted with amorphous $SiO_2$ formed by ashing rice hulls at 400° to 700° C. to form SiC whiskers.

* * * * *